US010852791B2

(12) United States Patent
Nielsen et al.

(10) Patent No.: US 10,852,791 B2
(45) Date of Patent: Dec. 1, 2020

(54) OPTIMIZED TOUCH TEMPERATURE THERMAL MANAGEMENT

(71) Applicant: Microsoft Technology Licensing, LLC, Redmond, WA (US)

(72) Inventors: Gregory Allen Nielsen, Kirkland, WA (US); Chau Van Ho, Des Moines, WA (US); Jason Marlan Pursel, Lake Stevens, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 53 days.

(21) Appl. No.: 16/150,260

(22) Filed: Oct. 2, 2018

(65) Prior Publication Data

US 2020/0033920 A1 Jan. 30, 2020

Related U.S. Application Data

(60) Provisional application No. 62/711,528, filed on Jul. 28, 2018.

(51) Int. Cl.
*G06F 1/20* (2006.01)
*G05D 23/19* (2006.01)
(Continued)

(52) U.S. Cl.
CPC ............. *G06F 1/206* (2013.01); *G05B 15/02* (2013.01); *G05D 23/1917* (2013.01);
(Continued)

(58) Field of Classification Search
USPC ....................................................... 700/300
See application file for complete search history.

(56) References Cited

U.S. PATENT DOCUMENTS 9,043,627 B2   5/2015  Culbert et al.
9,471,117 B1  10/2016  Spangler
(Continued)

FOREIGN PATENT DOCUMENTS

CN        102486181 A  *  6/2012

OTHER PUBLICATIONS

"ADT7460: Thermal Management Controller", Retrieved From https://web.archive.org/web/20111121002553/http://www.onsemi.com/PowerSolutions/product.do?id=ADT7460, Nov. 21, 2011, 2 Pages.

(Continued)

*Primary Examiner* — Emilio J Saavedra
(74) *Attorney, Agent, or Firm* — Ray Quinney & Nebeker P.C.; Paul N. Taylor

(57) ABSTRACT

Cooling of an electronic device is described herein. A sensor located at a first position determines a temperature at the first position. A processor identifies a fan speed of a fan positioned within the electronic device. The processor identifies a correlation between at least the determined temperature at the first position and the identified fan speed of the fan, and a temperature at a second position. The processor calculates an expected temperature at the second position using the identified correlation based on the determined temperature at the first position and the identified fan speed of the fan. The processor compares the calculated expected temperature at the second position to a predetermined temperature for the second position. The processor controls, based on the comparison, at least one component of the electronic device when the calculated expected temperature at the second position is greater than the predetermined temperature for the second position.

20 Claims, 4 Drawing Sheets

(51) Int. Cl.
    *H05K 7/20*            (2006.01)
    *G06F 17/11*          (2006.01)
    *G05B 15/02*          (2006.01)

(52) U.S. Cl.
    CPC ......... *G06F 17/11* (2013.01); *H05K 7/20209* (2013.01); *H05K 7/20836* (2013.01); *G06F 1/20* (2013.01); *G06F 1/203* (2013.01); *G06F 2200/201* (2013.01); *H05K 7/20718* (2013.01)

(56) References Cited

U.S. PATENT DOCUMENTS

| | | |
|---|---|---|
| 9,703,336 B2 | 7/2017 | Alton et al. |
| 9,785,209 B2 | 10/2017 | Vootukuru et al. |
| 2011/0301777 A1* | 12/2011 | Cox .................. G06F 1/206 700/299 |
| 2014/0240031 A1 | 8/2014 | Vadakkanmaruveedu et al. |

OTHER PUBLICATIONS

Both, David, "Linux monitoring tools to keep your hardware cool", Retrieved From https://opensource.com/life/15/11/linux-temperature-monitoring-tools, Nov. 20, 2015, 15 Pages.

Tang, et al., "Sensor-Based Fast Thermal Evaluation Model for Energy Efficient High-Performance", In Proceedings of Fourth International Conference on Intelligent Sensing and Information Processing, Oct. 15, 2006, 15 Pages.

* cited by examiner

OPTIMIZED TOUCH TEMPERATURE THERMAL MANAGEMENT

PRIORITY

This application claims the benefit of U.S. Provisional Application Ser. No. 62/711,528, filed on Jul. 28, 2018, which is hereby incorporated by reference in its entirety.

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
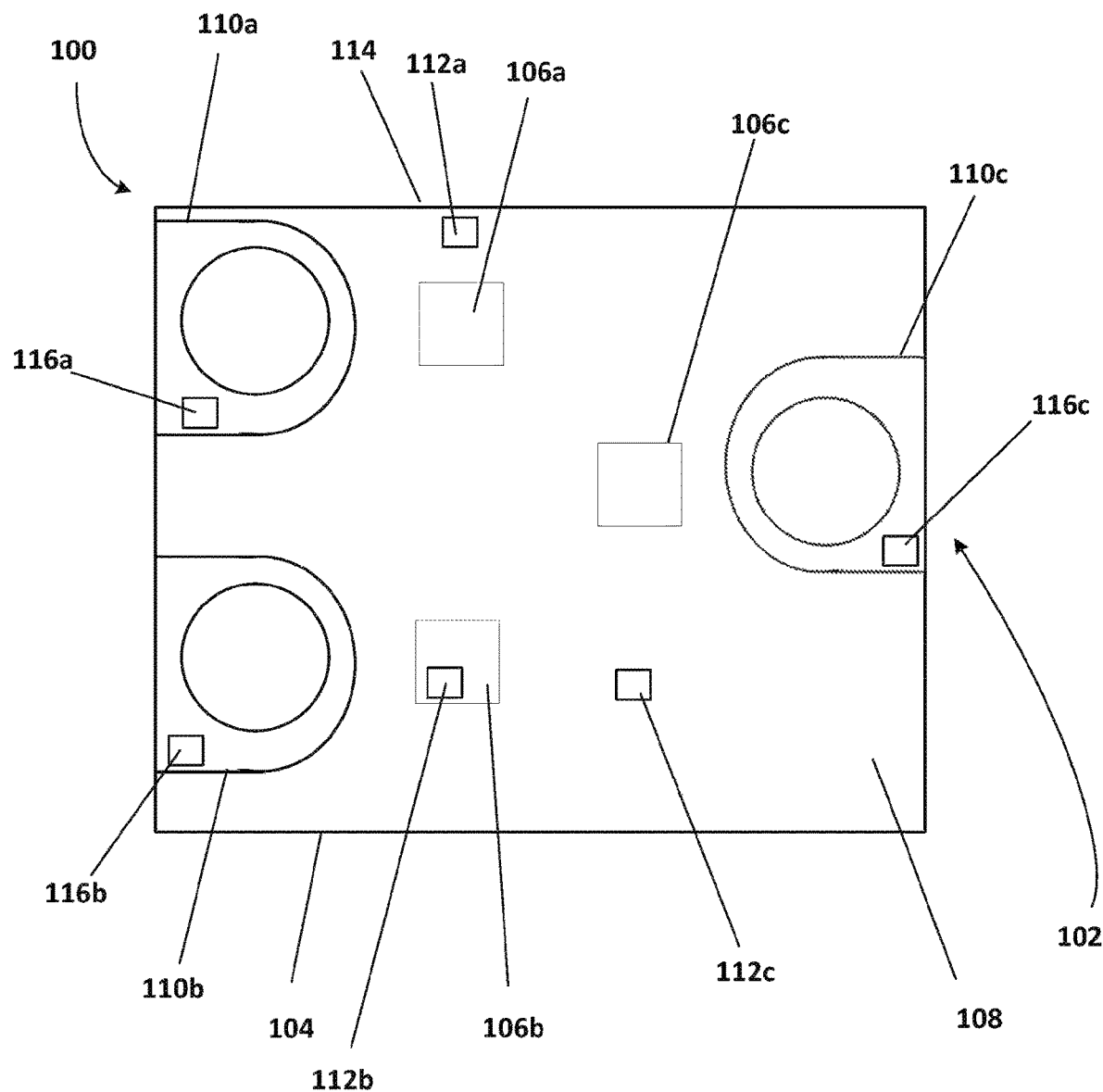
FIG. 1 depicts a top view of a computing device including an example of a thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life. Also, unless the power dissipated by the electronic device as heat is removed, outside surface touch areas of the electronic device (e.g., hotspot locations on a housing) increase in temperature.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. For forced convection, a computing device may include a number of fans used to move air through the computing device and cool one or more heat generating components of the computing device.

A thermal management system of the prior art may use sensors to track temperatures within the computing device (e.g., corresponding to components within the computing device and/or positions on the motherboard) and increases a speed of at least one of the fans and/or decreases an operating frequency for at least one heat generating component of the computing device when a tracked temperature approaches or exceeds a temperature limit. Higher fan speed results in more cooling and thus a lower temperature for the corresponding component and better system performance. Lower operating frequency results in less heat being generated and thus a lower temperature for the corresponding component.

A temperature limit of the prior art may be a relative temperature limit. For example, a sensor tracks a temperature for a position on the motherboard of the electronic device, and the temperature limit corresponds to the position on the motherboard. The position on the motherboard is, for example, opposite a hotspot location on the housing. The position on the motherboard may be cooled in a number of different ways (e.g., radiation, conduction, and convection), such that the temperature at the position on the motherboard is not the same as the temperature at the hotspot location on the housing. The temperature at the position on the motherboard thus has an offset and rises faster than the corresponding hotspot location. This may lead to a premature throttling of at least one heat generating component (e.g., with a decrease in operating frequency), a premature increase in fan speed, or a combination thereof when the temperature for the position on the motherboard is used to track the hotspot.

The tracked temperature for the position on the motherboard of the electronic device may not provide a good representation of the temperature at the hotspot location under a number of scenarios. For example, the tracked temperature for the position on the motherboard of the electronic device may not be a good representation of the temperature at the hotspot location for an electronic device with various loads that may stress system components differently and at different power levels, an electronic device that has various states or modes (e.g., fan profiles for different battery power specifications; different fan speeds for different slider positions within a graphical user interface), or an electronic device that is to accurately estimate hot spot temperatures (e.g., touch temperatures) through a large ambient temperature range.

Disclosed herein are apparatuses, systems, and methods for controlling speeds of fans and/or frequencies of heat generating components of an electronic device based on a temperature at the hotspot estimated using a formula correlating temperatures measured by one or more sensors within the electronic device, respectively, and fan speeds identified for one or more fans within the electric device, respectively, with the estimated temperature at the hotspot. The formula includes coefficients for each of the one or more sensors and the one or more fans, respectively, that are determined for a best curve fit (e.g., best linear fit) to actual temperatures determined for the hotspot experimentally or with a simulation. The actual temperatures for the hotspot may, for example, be determined in a lab environment under various workloads, modes (e.g., maximum fan speeds), and ambient temperatures.

The formula may be stored in a memory of the electronic device and used to estimate the temperature at the hotspot during operation of the electronic device. For example, the formula is ported to a driver or a controller integrated circuit (IC) that may calculate the estimated temperature at the hotspot using the formula, based on temperatures measured by the one or more sensors and fan speeds identified for the one or more fans, respectively, at a particular time point.

The estimated temperature at the hotspot may be communicated to a number of thermal policies that use the estimated temperature at the hotspot for thermal management algorithms such as, for example, throttling or emergency shutdowns. For example, the estimated temperature at the hotspot is compared to a predetermined temperature (e.g., a maximum temperature for the hotspot), and one or more heat generating components and/or one or more fans within the electronic device are controlled based on the comparison. For example, an operating frequency for a processor within the electronic device is decreased or a fan speed for a fan within the electronic device is decreased when the estimated temperature is greater than the predetermined temperature. The calculation of the estimated temperature, the comparison, and the conditional control may be repeated at, for example, a predetermined interval.

The use of the formula correlating the temperatures measured by the one or more sensors and the fan speeds identified for the one or more fans, respectively, with the estimated temperature at the hotspot allows for better tracking of the temperature at the hotspot (e.g., an outside touch area of the electronic device). Thermal management for the electronic device may be optimized, as premature throttling of at least one heat generating component and/or premature increase in fan speed may be reduced or avoided.

As an example, the improved thermal management for a computing device may be implemented by a method for cooling an electronic device. The method includes determining, by a sensor located at a first position, a temperature at the first position, the first position being within the electronic device. The method also includes identifying, by a processor in communication with the sensor, a fan speed of a fan positioned within the electronic device. The processor identifies a correlation between at least the determined temperature at the first position and the identified fan speed of the fan, and a temperature at a second position. The second position is on an outer surface of the electronic device. The processor calculates an expected temperature at the second position using the identified correlation based on the determined temperature at the first position and the identified fan speed of the fan. The processor compares the calculated expected temperature at the second position to a predetermined temperature for the second position. The processor controls, based on the comparison, at least one component of the electronic device when the calculated expected temperature at the second position is greater than the predetermined temperature for the second position.

Such thermal management methods, apparatuses, and systems have several potential end-uses or applications, including any electronic device having a hotspot that is not tracked by a temperature sensor. For example, the thermal management method may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The computing device 100 includes a housing 104 that supports at least the thermal management system 102 and one or more heat generating components or heat generating devices 106. The one or more heat generating components 106 may be any number of electrically powered devices including, for example, a processor, memory, a power supply, a graphics card, a hard drive, or another electrically powered device. The one or more heat generating components 106 may be supported by the housing 104 via, for example, a printed circuit board (PCB) 108 (e.g., a motherboard) attached to and/or supported by the housing 104. The one or more heat generating components 106 are in communication with each other and/or other electrical devices or components (e.g., fans) of the computing device 100 via the PCB 108, for example. The computing device 100 may include a number of components not shown in FIG. 1 (e.g., a hard drive, a power supply, connectors).

Three heat generating components 106 (e.g., first heat generating component 106a, second heat generating component 106b, and third heat generating component 106c) are shown in the example of FIG. 1. More or fewer heat generating components 106 may be included in the computing device. In one example, the heat generating component 106a is a processor, the heat generating component 106b is a graphics card, and the heat generating component 106c is a memory. In other examples, one or more of the heat generating components 106a, 106b, and 106c represent different components within the computing device 100 (e.g., a hard drive, a power supply, or another processor).

The thermal management system 102 includes one or more fans 110 to actively cool the one or more heat generating components 106, respectively, moving heat out of the computing device 100 via vents in the housing 104 of the computing device 100. The one or more fans 110 may rotate on any number of types of bearings including, for example, sleeve bearings, rifle bearings, ball bearings, fluid bearings, magnetic bearings, or another type of bearing. The one or more fans 110 may be sized and/or may rotate at a speed based on the heat generating component 106 to be cooled (e.g., based on the heat generated by the heat generating component 106 to be cooled). Each of the one or more fans 110 may be the same type of fan, or different types of fans may be used.

In the example shown in FIG. 1, the thermal management system 102 includes three fans 110 (e.g., first fan 110a, second fan 110b, and third fan 110c) to cool the three heat generating components 106a, 106b, and 106c, respectively. The thermal management system 102 may include more or fewer fans 110. The thermal management system 102 may include additional components (e.g., heat sinks and/or phase change devices) to aid in the removal of heat from the computing device 100. For example, the thermal management system 102 may include phase change devices (e.g., heat pipes and/or vapor chambers) physically attached or adjacent to a respective heat generating component 106 and a respective fan 110.

The thermal management system 102 also includes one or more sensors 112 that monitor temperatures within the housing 104. The one or more sensors 112 may be any number of different types of temperature sensors including, for example, a thermocouple, a resistance temperature detector (RTD) (e.g., a resistance wire RTD or a thermistor), or another type of temperature sensor. All of the one or more sensors 112 may be the same type of sensor, or different types of sensors may be used within the computing device 100.

As shown in the example of FIG. 1, the thermal management system 102 may include three sensors 112 (e.g., temperature sensors; a first sensor 112a, a second sensor 112b, and a third sensor 112c). The first sensor 112a monitors a temperature at a first position within the housing 104. The first sensor 112 may be positioned opposite a hotspot 114 on the housing 104 (e.g., a second position). The second sensor 112b monitors a temperature at a third position within the housing 104, and the third sensor 112c monitors a temperature at a fourth position within the housing 104. At least some positions of the first position, the third position, and the fourth position may be on the PCB 108. In one example, the first position, the third position, and the fourth position are associated with the first heat generating device 106a, the second heat generating device 106b, and the third heat generating device 106c, respectively.

Each of the first sensor 112a, the second sensor 112b, and the third sensor 112c may be positioned on the PCB 108 to best track a temperature at one or more hotspots, respectively. For example, operation of the first heat generating component 106a may at least partially produce the hotspot 114 on the housing 104. The first sensor 112a is disposed in a position (e.g., the first position) on the PCB 108 to best track the temperature at the hotspot 114 on the housing 104. The first position may be determined in any number of ways including, for example, experimentally. In another example, the first position, the third position, and the fourth position are located on the PCB 108 at shortest distances from a first hotspot (e.g., the hotspot 114), a second hotspot, and a third hotspot on the housing 104, respectively. In one example, the first position, the third position, and the fourth position are opposite the first hotspot, the second hotspot, and the third hotspot, respectively. More or fewer sensors may be provided to track more or fewer hotspots on the housing 104.

In one example, the first sensor 112a, the second sensor 112b, and the third sensor 112c are positioned on or adjacent to the first heat generating component 106a, the second heat generating component 106b, and the third heat generating component 106c, respectively. In one example, a sensor 112 monitors a temperature at a position within the computing device 100 not at or adjacent to one of the heat generating components 106. For example, the sensor 112 may monitor a temperature of a component of the thermal management system 102 (e.g., at a position on a phase change device such as a heat pipe). The thermal management system 102 may include more or fewer sensors 112.

As shown in the example of FIG. 1, the thermal management system 102 may also include three sensors 116 (e.g., fan speed sensors; a first sensor 116a, a second sensor 116b, and a third sensor 116c). The fan speed sensors 116 are in communication with corresponding fans 110 of the thermal management system 102 and monitor fan speed of the corresponding fans 110. For example, the first sensor 116a monitors a fan speed of the first fan 110a, the second sensor 116b monitors a fan speed of the second fan 110b, and the third sensor 116c monitors a fan speed of the third fan 110c. The fan speed sensors 116 monitor the fan speed of the corresponding fans 110 continuously or at intervals (e.g., predetermined intervals). The fan speed sensors 116 may include any number of different types of sensors including, for example, one or more Hall-effect sensors. The thermal management system 102 may include more or fewer fan speed sensors to monitor fan speed for more or fewer fans 110 of the thermal management system 102.

All of the sensors 112, 116 within the computing device 100 provide live closed-loop feedback to the thermal management system 102. For example, the thermal management system 102 includes a processor (e.g., a microcontroller; one of the heat generating components 106 or another processor within or outside the computing device 100). The processor 106a, for example, receives the live temperatures from the sensors 112a, 112b, 112c, 116a, 116b, and 116c and controls the fans 110a, 110b, and 110c and/or the heat generating components 106a, 106b, and 106c based on the methods described below to avoid both under cooling, which reduces system performance and component life expectancy, and over cooling.

Figure 2:
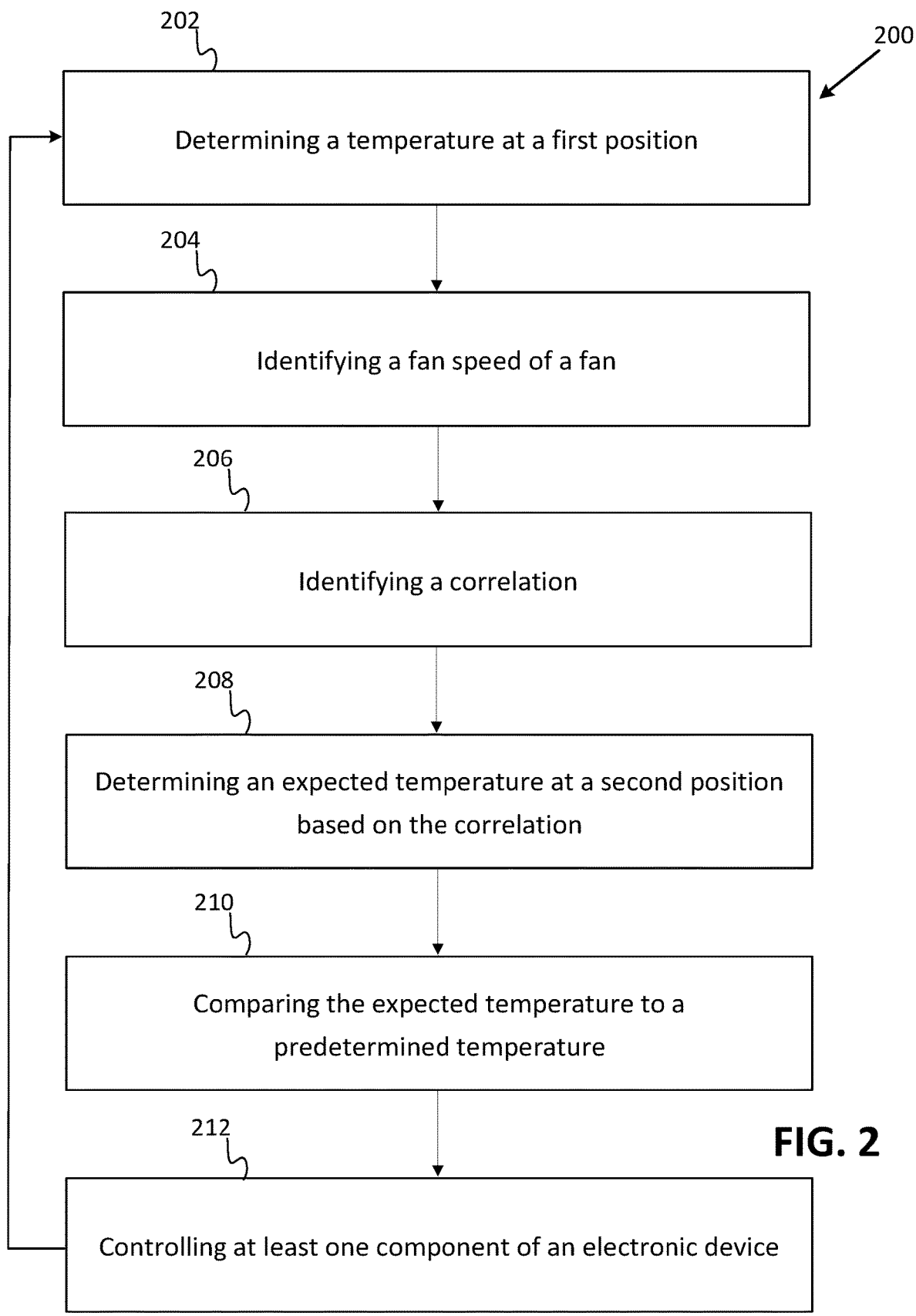
FIG. 2 is a flowchart of a method for cooling an electronic device in accordance with one example.

FIG. 2 shows a flowchart of one example of a method 200 for cooling an electronic device. The computing device may be a computing device shown in FIGS. 1 and 4 or may be another computing device. The method 200 is implemented in the order shown, but other orders may be used. Additional, different, or fewer acts may be provided. Similar methods may be used for transferring heat.

The electronic device may be any number of electronic devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player. The electronic device includes one or more heat generating devices to be cooled. For example, the one or more heat generating devices may be any number of electrically powered devices including, for example, a processor, memory, a power supply, a graphics card, a hard drive, or another electrically powered device. The electronic device may also include one or more fans to actively cool heat generating devices within the electronic device. In one example, the electronic device includes a number of sensors that correspond to the one or more heat generating devices and/or one or more hotspots, respectively. At least some of the one or more hotspots may be on an outer surface of the electronic device. The one or more hotspots may be formed by heat generated by the heat generating devices and transferred to the one or more hotspots, respectively, via radiation, convention, conduction, or any combination thereof.

In one example, at least one of the heat generating devices is a processor. In another example, none of the heat generating devices is the processor (e.g., the processor is located outside the electronic device, and data is transmitted from/to the sensors to/from the processor via a wired and/or wireless connection). The processor may be configured by hardware, software, firmware, or any combination thereof.

In act 202, a sensor (e.g., a temperature sensor) located at a first position determines a temperature at a first position. The first position is, for example, a position within the electronic device. In one example, the first position is a position at a heat generating component of the one or more heat generating components of the electronic device. In another example, the first position is a position on a PCB (e.g., a motherboard; a first motherboard position) of the electronic device. The first position may be a position on the motherboard of the electronic device that best tracks a temperature of a hotspot (e.g., a second position, at a hotspot on an outer surface of a housing of the electronic device). An optimal position for the first position may be determined with a simulation and/or by experimentation. In one example, the first position is a position on the motherboard opposite the second position at the housing of the electronic device.

The sensor provides live temperature feedback (e.g., in degrees Celsius, Fahrenheit, or Kelvin) to the processor via a circuit board, a wired connection, a wireless connection, or any combination thereof. In one example, the sensor determines the temperature at the first motherboard position, for example, at a plurality of time points. The sensor may determine the temperature at the first motherboard position at a predetermined interval (e.g., every 0.1 s, 0.5 s, 1.0 s) or may determine the temperature at the first motherboard position continuously. For example, the sensor may determine a first temperature, a second temperature, and a third temperature (e.g., a plurality of temperatures) at a first time point, a second time point, and a third time point (e.g., a plurality of time points), respectively, at the first motherboard position. More temperatures may be determined at additional time points. At least a subset of the determined temperatures may be stored in a memory within and/or outside of the electronic device.

In one example, the temperature sensor is a first temperature sensor, and the electronic device includes additional temperature sensors that determine temperatures at additional positions within the electronic device, respectively. For example, the electronic device also includes a second temperature sensor that is positioned and determines a temperature at a third position, and a third temperature sensor that is positioned and determines a temperature at a fourth position. The third position and the fourth position are within the electronic device. The electronic device may include more or fewer temperature sensors for monitoring temperatures within the electronic device, respectively. The second temperature sensor and the third temperature sensor, like the first temperature sensor, provide live temperature feedback (e.g., in degrees Celsius, Fahrenheit, or Kelvin) to the processor via a circuit board, a wired connection, a wireless connection, or any combination thereof.

In act 204, the processor, which is in communication with the sensor, identifies a fan speed of a fan positioned within the electronic device. For example, the electronic device may include a fan speed sensor adjacent to the fan. The fan speed sensor is in communication with the fan and monitors fan speed of the fan. For example, the fan speed sensor may include one or more Hall-effect sensors that are positioned adjacent to part (e.g., a shaft) of the fan and monitor rotation of the part of the fan. The fan speed sensor monitors the fan speed of the fan continuously or at intervals (e.g., predetermined intervals).

The processor may identify the fan speed of the fan in that the fan speed sensor provides live fan speed feedback (e.g., in rotations per minute (RPM)) to the processor via a circuit board, a wired connection, a wireless connection, or any combination thereof. In one example, the fan speed sensor determines the fan speed of the fan at a plurality of time points. The fan speed sensor may determine the fan speed of the fan at a predetermined interval (e.g., every 0.1 s, 0.5 s, 1.0 s) or may determine the fan speed of the fan continuously. For example, the fan speed sensor may determine a first fan speed, a second fan speed, and a third fan speed (e.g., a plurality of fan speeds) at the first time point, the second time point, and the third time point (e.g., the plurality of time points). In other words, the predetermined interval for the determination of the fan speed of the fan may correspond to the predetermined interval for the determination of the temperature in act 202. At least a subset of the determined fan speeds may be stored in a memory within and/or outside of the electronic device, and the processor identifying the fan speed of the fan may include the processor identifying the fan speed stored on the memory for a particular time point (e.g., the first time point).

In one example, the fan speed sensor is a first fan speed sensor, and the electronic device includes additional fan speed sensors that determine fan speeds of additional fans within the electronic device, respectively. For example, the electronic device also includes a second fan speed sensor that determines a fan speed of a second fan, and a third fan speed sensor that determines a fan speed of a third fan. The electronic device may include more or fewer fan speed sensors for monitoring fan speeds of more or fewer fans within the electronic device, respectively. The second fan speed sensor and the third fan speed sensor, like the first fan speed sensor, provide live fan speed feedback (e.g., in RPM) to the processor via a circuit board, a wired connection, a wireless connection, or any combination thereof.

In act 206, the processor identifies a correlation between at least the determined temperature at the first position and the identified fan speed of the fan, with a temperature at a second position. The correlation is, for example, a first degree polynomial equation. In other examples, the correlation takes a different form. For example, the correlation may be a higher degree (e.g., a second degree) polynomial equation. The first degree polynomial equation, for example, correlates at least the determined temperature at the first position and the identified fan speed of the fan, with the temperature at the second position. For example, the first degree polynomial equation includes coefficients associated with at least the determined temperature at the first position and the identified fan speed of the fan, respectively, and an offset.

The correlation is stored in the memory, and the processor identifies the correlation in the memory. The processor may identify the correlation from a plurality of correlations stored in the memory (e.g., for different hotspots), or the identified correlation may be the only correlation stored in the memory. The processor may receive the correlation from another processor outside the electronic device. In one example, identifying the correlation may include the processor of the electronic device or the other processor outside the electronic device generating the correlation according to the method shown in FIG. 3 or another method.

Figure 3:
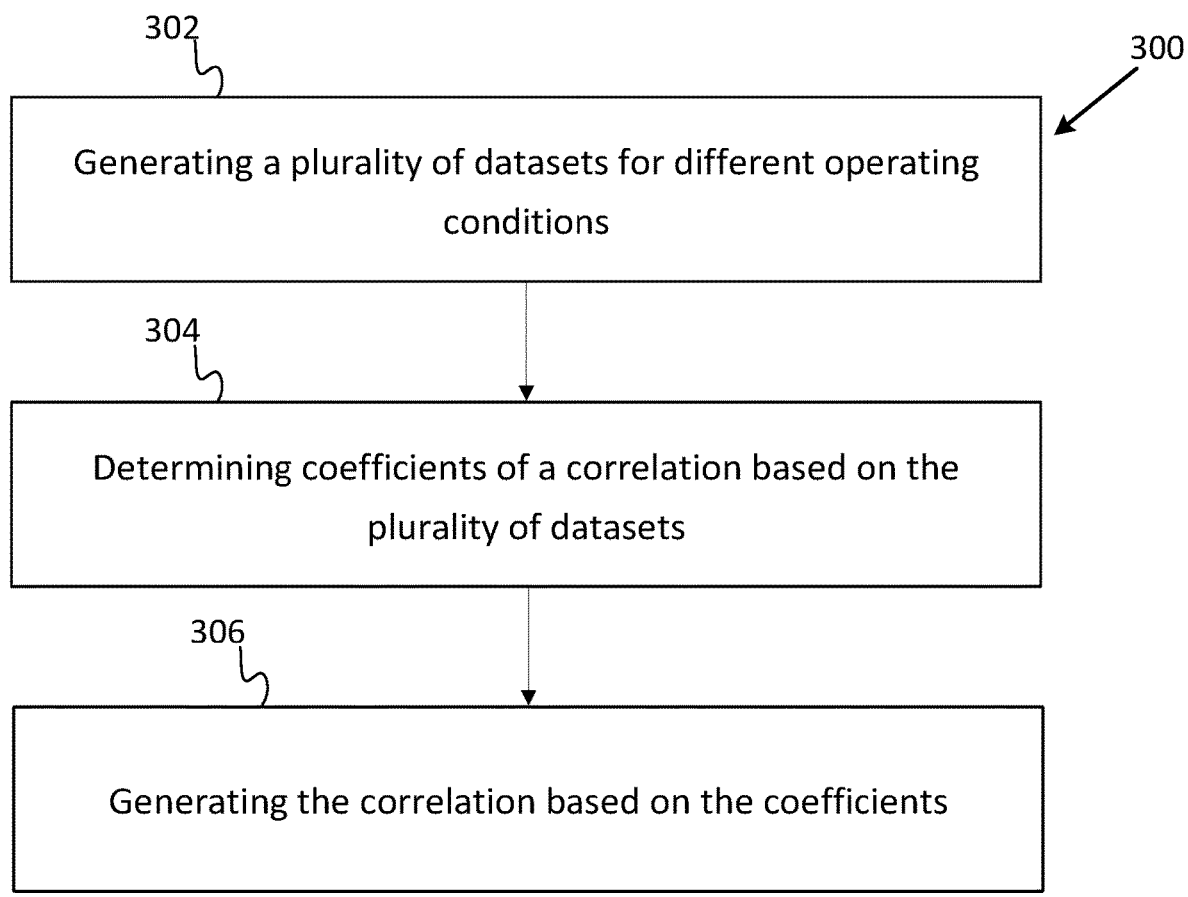
FIG. 3 is a flowchart of a method for modeling touch temperature in accordance with one example.

FIG. 3 shows a flowchart of one example of a method 300 for modeling touch temperature. The touch temperature may be modeled by the computing device shown in FIGS. 1 and 4 or another computing device. The method 300 is implemented in the order shown, but other orders may be used. Additional, different, or fewer acts may be provided. Similar methods may be used for modeling touch temperature.

In act 302, a processor (e.g., the processor of the electronic device or the other processor outside of the electronic device) generates a plurality of datasets for different operating conditions for the electronic device or another electronic device. For example, the processor generates a plurality of datasets for different operating conditions for an electronic device that is of a same type as the electronic device referenced in FIG. 2. The plurality of datasets may be historical data. For example, the plurality of datasets may include experimental data, simulation data, or a combination thereof. In one example, the historical data is generated in a laboratory setting with a prototype of an electronic device before the electronic device is manufactured and sold to the public. Alternatively, the plurality of datasets may be generated with a computer simulation. Datasets may be generated for any number of different operating conditions for the electronic device. For example, the different operating conditions may include different workloads for the electronic device, different modes for the electronic device, different ambient temperatures for the electronic device, and/or other operating conditions.

Generating each dataset of the plurality of datasets includes determining, by a first temperature sensor within the electronic device, the temperature at the first position (see act 202 of the method 200) for the respective one of the different operating conditions, and identifying the fan speed of the fan (e.g., a first fan) for the respective one of the different operating conditions (see act 204 of the method 200). Generating the respective dataset may also include determining temperatures at other positions within the electronic device and identifying fan speeds of other fans within the electronic device for the respective one of the operating conditions. For example, generating the respective dataset includes determining, by the second temperature sensor within the electronic device, the temperature at the third position, determining, by the third temperature sensor within the electronic device, the temperature at the fourth position, and identifying the fan speed for the second fan for the respective one of the operating conditions. More or fewer temperatures within the electronic device may be determined, and/or fan speeds for more or fewer fans within the electronic device may be identified.

Generating the respective dataset also includes determining, by a temperature sensor on the electronic device, the temperature at the second position for the respective one of the different operating conditions. The second position is, for example, at a hotspot on an outer surface of a housing of the electronic device. In other examples, the second position is located elsewhere but is a position at which temperature is to be tracked without direct feedback from a temperature sensor. In one example, temperatures for a plurality of hotspots on one or more outer surfaces of the electronic device are determined and stored.

Each dataset of the plurality of datasets thus includes values for at least the determined temperature at the first position for the respective one of the different operating conditions, the identified fan speed of the fan for the respective one of the different operating conditions, and the determined temperature at the second position for the respective one of the different operating conditions, respectively. Each dataset of the plurality of datasets may include more values for temperatures within the electronic device and/or more values for fan speeds of fans within the electronic device.

The plurality of datasets are stored in a memory. The plurality of datasets correspond to the different operating conditions, respectively. For example, a first dataset of the plurality of datasets corresponds to a first workload for the electronic device operating in a first mode (e.g., a first fan profile), with an ambient temperature of 25 degrees Celsius, and a second dataset of the plurality of datasets corresponds to the first workload for the electronic device operating in the first mode, with an ambient temperature of 30 degrees Celsius. The more datasets generated and stored for the particular type of electronic device, the more accurate the modeled touch temperature may be.

In act 304, the processor determines coefficients of a correlation (e.g., an equation) based on the plurality of datasets generated in act 302. The plurality of datasets may, for example, be stored in a table, with each row of data representing a respective one of the operating conditions and each of the columns representing a value for a determined temperature (e.g., the determined temperature at the first position, the determined temperature at the second position) or an identified fan speed (e.g., the fan speed for the first fan). Within each column of data, the values have a same unit of measurement. For example, all of the values within a first column of data represent determined temperatures for the first position in degrees Celsius, and all of the values within a second column of data represent identified fan speeds for the first fan in revolutions per minute (RPMs). Other units of measurement may be used. In one example, different units may be used for different sensors or fans. For example, all of the values within the first column of data represent determined temperatures for the first position in degrees Celsius, and all of the values within a first column of data represent determined temperatures for the second position in degrees Farenheit.

Using a statistical modeling tool such as, for example, JMP, the processor analyzes the plurality of datasets. Using the statistical modeling tool, the processor fits a curve to the plurality of datasets. In one example, using the statistical modeling tool, the processor generates a formula with coefficients for each of the determined temperatures and each of the identified fan speeds for a best linear fit to the tracked hotspot temperatures. In other examples, the formula may be a higher order curve fit. The processor may curve fit the plurality of datasets using any number of regression methods including, for example, the method of least squares.

In one example, the processor determines coefficients for more than one correlation. For example, using the statistical modeling tool, the processor generates a number of formulas (e.g., with coefficients for each of the determined temperatures and each of the fan speeds) for best curve fits (e.g. linear fits) to temperatures at a number of different hotspots on the electronic device, respectively.

In act 306, the processor generates the formula based on the coefficients determined in act 304. In one example, the processor generates a plurality of formulas corresponding to a plurality of hotspots, respectively. The processor or a user analyzes the coefficients to determine which determined temperatures (e.g., temperatures determined by which sensors; the determined temperatures at the first position) and/or which identified fan speeds (e.g., for which fans; the identified fan speeds of the first fan) best correlate with tracked hotspot temperatures (e.g., touch temperature; the determined temperatures at the second position). The processor or a user may determine which determined temperatures and/or which identified fan speeds best correlate with a tracked hotspot temperature based on the determined coefficients. For example, a determined coefficient below a corresponding predetermined threshold may be ignored (e.g., removed from the equation). For example, if a coefficient for temperatures determined by a sensor is below 0.01, the representation of the sensor may be removed from the equation, and if a coefficient for fan speeds identified for a fan is below 0.001, the representation of the fan may be removed from the equation. Different thresholds may be used.

The equation below is an example of a formula generated in act 306:

$$VTS = Sensor\_A * Ca + Sensor\_B * Cb + Sensor\_C * Cc + RPM * Crpm + Offset,$$

where: VTS is the virtual temperature sensor providing an estimated temperature at, for example, the second position (e.g., the hotspot position on the electronic device); Sensor_A is the determined temperature by the first sensor at the first position; Ca is the coefficient calculated for the first sensor by the statistical modeling tool; Sensor_B is the determined temperature by the second sensor at the third position; Cb is the coefficient calculated for the second sensor by the statistical modeling tool; Sensor_C is the determined temperature by the third sensor at the fourth position; Cc is the coefficient calculated for the third sensor by the statistical modeling tool; RPM is the identified fan speed of the first fan; Crpm is the coefficient calculated for the first fan by the statistical modeling tool; and Offset is an offset for the linear fit calculated in act 306 by the statistical modeling tool.

Based on thresholding, the formula may include more or fewer terms. In other examples, the equation correlates only temperatures within the electronic device, only fan speeds of fans within the electronic device, or additional or fewer temperatures and/or fan speeds with the temperature at the second position.

Referring again to FIG. 2, in act 208, the processor determines (e.g., calculates) an expected temperature at the second position (e.g., a first hotspot position) using the correlation identified in act 206, based on at least the temperature at the first position determined in act 202 and the fan speed of the fan identified in act 204. For example, at least the temperature at the first position determined in act 202 and the fan speed of the fan identified in act 204 are input into the correlation identified in act 206 to calculate the expected temperature at the second position.

In one example, the calculated expected temperature at the second position is transmitted to software and/or hardware of a thermal management system of the electronic device (e.g., participants in thermal management algorithms). For example, the calculated expected temperature at the second position is transmitted to BIOS and/or a Unified Extensible Firmware Interface (UEFI), a microcontroller, and/or an operating system (OS) driver within the electronic device. The BIOS, the UEFI, the microcontroller, the OS driver, other software and/or hardware within the electronic device, or any combination thereof perform thermal management functions within the thermal management system of the electronic device and may use the transmitted expected temperature at the second position as part of the thermal management functions.

In act 210, the determined expected temperature at the second position is compared to a predetermined temperature for the second position (e.g., the first hotspot position). In one example, the comparison includes calculation of a difference between the determined expected temperature at the second position and the predetermined temperature for the second position.

The predetermined temperature for the first hotspot position is an absolute temperature for the first hotspot position that is not to be exceeded (e.g., an absolute trip point or an absolute temperature threshold). The predetermined temperature is stored in the memory or another memory and is predetermined based on any number of factors including, for example, comfort of a user of the electronic device. The predetermined temperature may be one of a plurality of predetermined temperatures stored in the memory or the other memory. The plurality of predetermined temperatures may correspond to different hotspot positions on the housing of the electronic device, for example, and/or different operating conditions of the electronic device. For example, the absolute trip point for the first hotspot position, depending on where the first hotspot position is located on the housing of the electronic device, may be different when the electronic device is charging compared to when the electronic device is not charging.

In act 212, at least one component of the electronic device is controlled when the determined expected temperature for the second position (e.g., the calculated average temperature for the first hotspot position) is greater than the predetermined temperature for the second position. For example, the processor or another processor may generate a control signal and transmit the control signal to the at least one component of the electronic device based on the comparison of act 210. The transmitted control signal instructs the at least one component of the electronic device to take any number of actions.

In one example, when the determined expected temperature for the first hotspot temperature is greater than, or greater than or equal to the absolute trip point for the first hotspot position, the processor or another processor may increase a speed of at least one of the fans, decrease an operating frequency (e.g., throttle) of at least one of the heat generating devices (e.g., the processor), limit (e.g., throttle) a charge current to at least one of the heat generating devices (e.g., a battery), or any combination thereof. The processor or the other processor may gradually throttle the at least one heat generating device, may severely throttle the at least one heat generating device, or may shut down the at least one heat generating device. By increasing the speed of at least one of the fans and/or decreasing the operating frequency of at least one of the heat generating devices, the temperature at the first hotspot position may be decreased.

In one example, the processor or the other processor determines whether to gradually throttle, severely throttle, or shut down the at least one heat generating device based on an amount the determined expected temperature for the first hotspot position is greater than the absolute trip point for the first hotspot position. For example, if the amount is less than or equal to one degree Fahrenheit, the processor may gradually throttle the at least one heat generating device by 10% or less; if the amount is less than or equal to two degrees Fahrenheit but more than one degree Fahrenheit, the processor may severely throttle the at least one heat generating device by 50% or more; and if the amount is greater than two degrees Fahrenheit, the processor may shut down the at least one heat generating device. Other throttling percentages and temperature thresholds for the different actions may be used. In another example, the processor or the other processor determines how much to increase the speed of the at least one fan based on the amount the determined expected temperature for the first hotspot position is greater than the absolute trip point for the first hotspot position.

After act 212, the method 200 may return to act 202. The method may be a closed loop in that a thermal management system of the electronic device is continuously monitoring the temperatures calculated for hotspots on the housing of the electronic device or is monitoring the temperatures calculated for the hotspots at a predetermined interval.

Figure 4:
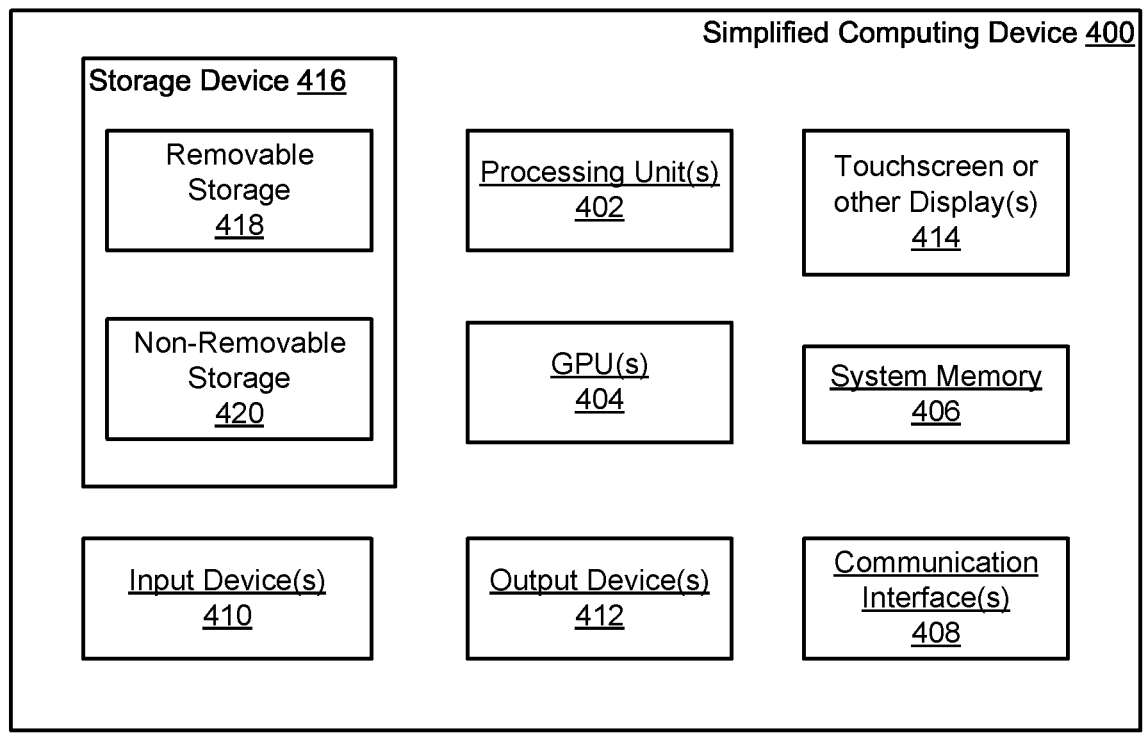
FIG. 4 is a block diagram of a computing environment in accordance with one example for implementation of the disclosed methods or one or more electronic devices.

With reference to FIG. 4, a thermal management system, as described above, may be incorporated within an exemplary computing environment 400. The computing environment 400 may correspond with one of a wide variety of computing devices, including, but not limited to, personal computers (PCs), server computers, tablet and other hand-held computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fans).

The computing environment 400 has sufficient computational capability and system memory to enable basic computational operations. In this example, the computing environment 400 includes one or more processing units 402, which may be individually or collectively referred to herein as a processor. The computing environment 400 may also include one or more graphics processing units (GPUs) 404. The processor 402 and/or the GPU 404 may include integrated memory and/or be in communication with system memory 406. The processor 402 and/or the GPU 404 may be a specialized microprocessor, such as a digital signal processor (DSP), a very long instruction word (VLIW) processor, or other microcontroller, or may be a general purpose central processing unit (CPU) having one or more processing cores. The processor 402, the GPU 404, the system memory 406, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 408. One or more computer input devices 410 (e.g., pointing devices, keyboards, audio input devices, video input devices, haptic input devices, or devices for receiving wired or wireless data transmissions) may be provided. The input devices 410 may include one or more touch-sensitive surfaces, such as track pads. Various output devices 412, including touchscreen or touch-sensitive display(s) 414, may also be provided. The output devices 412 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 416 and includes both volatile and nonvolatile media, whether in removable storage 418 and/or non-removable storage 420. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 400.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a method for cooling an electronic device includes determining, by a sensor located at a first position, a temperature at the first position, the first position being within the electronic device. The method also includes identifying, by a processor in communication with the sensor, a fan speed of a fan positioned within the electronic device. The processor identifies a correlation between at least the determined temperature at the first position and the identified fan speed of the fan, and a temperature at a second position. The second position is on an outer surface of the electronic device. The processor calculates an expected temperature at the second position using the identified correlation based on the determined temperature at the first position and the identified fan speed of the fan. The processor compares the calculated expected temperature at the second position to a predetermined temperature for the second position. The processor controls, based on the comparison, at least one component of the electronic device when the calculated expected temperature at the second position is greater than the predetermined temperature for the second position.

In a second embodiment, with reference to the first embodiment, identifying the correlation includes identifying, by the processor, a formula correlating at least the determined temperature at the first position and the identified fan speed of the fan, and the expected temperature at the second position.

In a third embodiment, with reference to the second embodiment, the identified formula is a first degree polynomial equation.

In a fourth embodiment, with reference to the second embodiment, the sensor is a first sensor. The method further includes generating the formula. Generating the formula includes generating a plurality of datasets for different operating conditions for the electronic device, respectively. Generating each dataset of the plurality of datasets includes determining the temperature at the first position for a respective one of the different operating conditions, identifying the fan speed of the fan for the respective one of the different operating conditions, and determining, by a second sensor located at the second position, a temperature at the second position for the respective one of the different operating conditions. Generating the formula further includes determining the coefficients of the formula based on the plurality of datasets for the different operating conditions and generating the formula based on the determined coefficients.

In a fifth embodiment, with reference to the fourth embodiment, the different operating conditions include different workloads for the electronic device, different modes for the electronic device, and different ambient temperatures for the electronic device.

In a sixth embodiment, with reference to the fourth embodiment, determining the coefficients of the formula includes generating a best curve fit to the determined temperatures at the second position for the different operating conditions.

In a seventh embodiment, with reference to the second embodiment, the method further includes storing, by a memory in communication with the processor, the generated formula. Identifying the correlation includes identifying, by the processor, the generated formula stored in the memory. Calculating the expected temperature at the second position includes inputting, by the processor, the determined temperature at the first position and the identified fan speed of the fan into the generated formula.

In an eighth embodiment, with reference to the first embodiment, the sensor is a first sensor. The method further includes determining, by a second sensor located at a third position, a temperature at the third position. The third position is within the electronic device. The calculated expected temperature at the second position is also based on the temperature at the third position.

In a ninth embodiment, with reference to the first embodiment, controlling the at least one component includes increasing a speed of the fan, increasing a speed of at least one other fan positioned within the electronic device, decreasing an operating frequency of the processor, decreasing an operating frequency of at least one heat generating component of the electronic device, or any combination thereof.

In a tenth embodiment, with reference to the first embodiment, the sensor is a first sensor, the fan is a first fan, the correlation is a first correlation, and the outer surface is a first outer surface. The method further includes determining, by a second sensor located at a third position, a temperature at the third position. The third position is within the electronic device. The method further includes identifying, by the processor, which is in communication with the second sensor, a fan speed of a second fan positioned within the electronic device, and identifying, by the processor, a second correlation. The second correlation is between at least the determined temperature at the first position, the determined temperature at the third position, the identified fan speed of the first fan, the identified fan speed of the second fan, or any combination thereof, and a temperature at a fourth position. The fourth position is on the first outer surface of the electronic device or a second outer surface of the electronic device. The method further includes calculating, by the processor, an expected temperature at the fourth position using the identified second correlation, based on the determined temperature at the first position, the determined temperature at the third position, the identified fan speed of the first fan, the identified fan speed of the second fan, or any combination thereof. The method includes comparing, by the processor, the calculated expected temperature at the fourth position to a predetermined temperature for the fourth position, and controlling, by the processor, based on the comparison of the calculated expected temperature at the fourth position to the predetermined temperature for the fourth position, the at least one component of the electronic device or at least one other component of the electronic device when the calculated expected temperature at the fourth position is greater than the predetermined temperature for the fourth position.

In an eleventh embodiment, with reference to the first embodiment, the first position is at a motherboard of the electronic device, and the second position is at a housing of the electronic device.

In a twelfth embodiment, a computing device includes a first sensor located at a first position and operable to determine a temperature at the first position, a second sensor located at a second position and operable to determine a temperature at the second position, a fan, and a processor in communication with the first sensor, the second sensor, and the fan. The processor is configured to identify a formula that correlates at least the determined temperature at the first position and the determined temperature at the second position, with a temperature at a third position. The third position is on an outer surface of the electronic device. The processor is further configured to calculate an expected temperature at the third position using the identified formula, based on the determined temperature at the first position and the determined temperature at the second position, and compare the calculated expected temperature at the third position to a predetermined temperature for the third position. The processor is further configured to control, based on the comparison, the fan or the processor when the calculated expected temperature for the third position is greater than the predetermined temperature for the third position.

In a thirteenth embodiment, with reference to the twelfth embodiment, the control of the fan or the processor comprises increase of a speed of the fan, decrease of an operating frequency of the processor, or a combination thereof.

In a fourteenth embodiment, with reference to the twelfth embodiment, the computing device further includes a memory in communication with the processor. The memory is configured to store the formula. The identification of the formula includes identification of the formula stored on the memory.

In a fifteenth embodiment, with reference to the twelfth embodiment, the processor is further configured to identify a fan speed of the fan. The formula correlates at least the determined temperature at the first position, the determined temperature at the second position, and the identified fan speed, with the temperature at the third position.

In a sixteenth embodiment, with reference to the fifteenth embodiment, the formula includes coefficients associated with the determined temperature at the first position, the determined temperature at the second position, and the identified fan speed of the fan, respectively.

In a seventeenth embodiment, with reference to the sixteenth embodiment, the coefficients are based on historical data. The historical data includes experimental data, simulation data, or a combination thereof. The historical data includes datasets for different operating conditions of the computing device. The different operating conditions include different workloads for the computing device, different modes for the computing device, different ambient temperatures in which the computing device operates, or any combination thereof. Each of the datasets includes data representing the determined temperature at the first position, the determined temperature at the second position, the identified fan speed of the fan, and a determined temperature at the third position for a respective one of the different operating conditions of the computing device.

In an eighteenth embodiment, a method for cooling an electronic device includes determining, by a sensor located at a first position within or on the electronic device, a temperature at the first position. The method also includes identifying, by a processor in communication with the sensor, a fan speed of a fan positioned within the electronic device, and identifying a formula relating at least the determined temperature at the first position and the identified fan speed of the fan to a temperature at a second position. The second position is on an outer surface of the electronic device. Identifying the formula includes generating a plurality of datasets for different operating conditions of the electronic device, respectively. Each dataset of the plurality of datasets includes at least the temperature at the first position, a temperature at the second position, and the fan speed of the fan for a respective one of the different operating conditions. Identifying the formula also includes determining coefficients of the formula based on the plurality of datasets for the different operating conditions. Determining the coefficients includes generating a best curve fit to the temperatures at the second position of the plurality of datasets for the different operating conditions. Identifying the formula includes generating the formula based on the determined coefficients. The method also includes calculating, by the processor, an expected temperature at the second position using the identified formula, based on the determined temperature at the first position and the identified fan speed of the fan, and controlling, by the processor, at least one component of the electronic device based on the calculated expected temperature at the second position.

In a nineteenth embodiment, with reference to the eighteenth embodiment, the sensor is a first sensor. The method further includes determining, by a second sensor located at a third position within or on the electronic device, a temperature at the third position. Identifying the formula further includes identifying which one or more sensors of at least the first sensor and the second sensor best relate to the temperature at the second position. Identifying which one or more sensors of at least the first sensor and the second sensor best relate to the temperature at the second position includes analyzing the plurality of datasets using a statistical modeler.

In a twentieth embodiment, with reference to the nineteenth embodiment, the identified formula is a first degree polynomial equation.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A method for cooling an electronic device, the method comprising:
    determining, by a sensor located at a first position, a temperature at the first position, the first position being within the electronic device;
    identifying, by a processor in communication with the sensor, a fan speed of a fan positioned within the electronic device;
    identifying, by the processor, a correlation between at least the determined temperature at the first position and the identified fan speed of the fan, and a temperature at a second position, the second position being on an outer surface of the electronic device;
    calculating, by the processor, an expected temperature at the second position using the identified correlation based on the determined temperature at the first position and the identified fan speed of the fan, wherein calculating the expected temperature at the second position comprises inputting, by the processor, the determined temperature at the first position and the identified fan speed of the fan into a formula stored in a memory that correlates at least the determined temperature at the first position and the identified fan speed of the fan, and the expected temperature at the second position;
    comparing, by the processor, the calculated expected temperature at the second position to a predetermined temperature for the second position;
    and controlling, by the processor, based on the comparison, at east one component of the electronic device to promote cooling when the calculated expected temperature at the second position is greater than the predetermined temperature for the second position.

2. The method of claim 1, wherein the formula includes coefficients associated with the determined temperature at the first position and the identified fan speed of the fan, respectively.

3. The method of claim 1, wherein the identified formula is a first degree polynomial equation.

4. The method of claim 2, wherein the sensor is a first sensor,
    wherein the method further comprises generating the formula, generating the formula comprising:
        generating a plurality of datasets for different operating conditions for the electronic device, respectively, generating each dataset of the plurality of datasets comprising:
            determining the temperature at the first position for a respective one of the different operating conditions;
            identifying the fan speed of the fan for the respective one of the different operating conditions; and
            determining, by a second sensor located at the second position, a temperature at the second position for the respective one of the different operating conditions;
        determining the coefficients of the formula based on the plurality of datasets for the different operating conditions; and
        generating the formula based on the determined coefficients.

5. The method of claim 4, wherein the different operating conditions include different workloads for the electronic device, different modes for the electronic device, and different ambient temperatures for the electronic device.

6. The method of claim 4, wherein determining the coefficients of the formula comprises generating a best curve fit to the determined temperatures at the second position for the different operating conditions.

7. The method of claim 1, wherein the sensor is a first sensor,
    wherein the method further comprises determining, by a second sensor located at a third position, a temperature at the third position, the third position being within the electronic device, and
    wherein the calculated expected temperature at the second position is also based on the temperature at the third position.

8. The method of claim 1, wherein controlling the at least one component comprises increasing a speed of the fan, increasing a speed of at least one other fan positioned within the electronic device, decreasing an operating frequency of the processor, decreasing an operating frequency of at least one heat generating component of the electronic device, or any combination thereof.

9. The method of claim 1, wherein the sensor is a first sensor, the fan is a first fan, the correlation is a first correlation, and the outer surface is a first outer surface, wherein the method further comprises:
  determining, by a second sensor located at a third position, a temperature at the third position, the third position being within the electronic device;
  identifying, by the processor, which is in communication with the second sensor, a fan speed of a second fan positioned within the electronic device;
  identifying, by the processor, a second correlation, the second correlation being between at least the determined temperature at the first position, the determined temperature at the third position, the identified fan speed of the first fan, the identified fan speed of the second fan, or any combination thereof, and a temperature at a fourth position, the fourth position being on the first outer surface of the electronic device or a second outer surface of the electronic device;
  calculating, by the processor, an expected temperature at the fourth position using the identified second correlation, based on the determined temperature at the first position, the determined temperature at the third position, the identified fan speed of the first fan, the identified fan speed of the second fan, or any combination thereof;
  comparing, by the processor, the calculated expected temperature at the fourth position to a predetermined temperature for the fourth position; and
  controlling, by the processor, based on the comparison of the calculated expected temperature at the fourth position to the predetermined temperature for the fourth position, the at least one component of the electronic device or at least one other component of the electronic device when the calculated expected temperature at the fourth position is greater than the predetermined temperature for the fourth position.

10. The method of claim 1, wherein the first position is at a motherboard of the electronic device, and the second position is at a housing of the electronic device.

11. The method of claim 1, wherein the formula is a higher order curve fit.

12. A computing device comprising:
  a first sensor located at a first position and operable to determine a temperature at the first position;
  a second sensor located at a second position and operable to determine a temperature at the second position;
  a fan;
  a processor in communication with the first sensor, the second sensor, and the fan, the processor being configured to:
  identify a formula that correlates at least the determined temperature at the first position, the determined temperature at the second position, and an identified fan speed, with a temperature at a third position, the third position being on an outer surface of the electronic device;
  calculate an expected temperature at the third position using the identified formula by inputting into the formula the determined temperature at the first position, the determined temperature at the second position, and the identified fan speed;
  compare the calculated expected temperature at the third position to a predetermined temperature for the third position;
  and control, based on the comparison, the fan or the processor when the calculated expected temperature for the third position is greater than the predetermined temperature for the third position.

13. The computing device of claim 12, wherein the control of the fan or the processor comprises increase of a speed of the fan, decrease of an operating frequency of the processor, or a combination thereof.

14. The computing device of claim 12, further comprising a memory in communication with the processor, the memory being configured to store the formula,
  wherein the identification of the formula comprises identification of the formula stored on the memory.

15. The computing device of claim 12, wherein the processor is further configured to identify a fan speed of the fan, and
  wherein the formula correlates at least the determined temperature at the first position, the determined temperature at the second position, and the identified fan speed, with the temperature at the third position.

16. The computing device of claim 15, wherein the formula includes coefficients associated with the determined temperature at the first position, the determined temperature at the second position, and the identified fan speed of the fan, respectively.

17. The computing device of claim 16, wherein the coefficients are based on historical data, the historical data including experimental data, simulation data, or a combination thereof, and
  wherein the historical data comprises datasets for different operating conditions of the computing device, the different operating conditions including different workloads for the computing device, different modes for the computing device, different ambient temperatures in which the computing device operates, or any combination thereof, and
  wherein each of the datasets includes data representing the determined temperature at the first position, the determined temperature at the second position, the identified fan speed of the fan, and a determined temperature at the third position for a respective one of the different operating conditions of the computing device.

18. A method for cooling an electronic device, the method comprising:
  determining, by a sensor located at a first position within or on the electronic device, a temperature at the first position;
  identifying, by a processor in communication with the sensor, a fan speed of a fan positioned within the electronic device;
  identifying a formula relating at least the determined temperature at the first position and the identified fan speed of the fan to a temperature at a second position, the second position being on an outer surface of the electronic device, the identifying of the formula comprising:
  generating a plurality of datasets for different operating conditions of the electronic device, respectively, each dataset of the plurality of datasets including at least the temperature at the first position, a temperature at the second position, and the fan speed of the fan for a respective one of the different operating conditions;

determining coefficients of the formula based on the plurality of datasets for the different operating conditions, the determining of the coefficients comprising generating a best curve fit to the temperatures at the second position of the plurality of datasets for the different operating conditions;

and generating the formula based on the determined coefficients;

calculating, by the processor, an expected temperature at the second position using the identified formula by inputting into the formula the determined temperature at the first position and the identified fan speed of the fan;

and controlling, by the processor, at least one component of the electronic device to promote cooling based on the calculated expected temperature at the second position.

19. The method of claim 18, wherein the sensor is a first sensor, wherein the method further comprises determining, by a second sensor located at a third position within or on the electronic device, a temperature at the third position, and wherein identifying the formula further comprises identifying which one or more sensors of at least the first sensor and the second sensor best relate to the temperature at the second position, identifying which one or more sensors of at least the first sensor and the second sensor best relate to the temperature at the second position comprising analyzing the plurality of datasets using a statistical modeler.

20. The method of claim 19, wherein the identified formula is a first degree polynomial equation.

* * * * *